United States Patent [19]

Simone

[11] Patent Number: 4,953,184
[45] Date of Patent: Aug. 28, 1990

[54] COMPLEX BANDPASS DIGITAL FILTER

[75] Inventor: Daniel A. Simone, Barrington, Ill.

[73] Assignee: Motorola, Inc., Schaumburg, Ill.

[21] Appl. No.: 359,547

[22] Filed: Jun. 1, 1989

[51] Int. Cl.⁵ .............................................. H04B 1/10
[52] U.S. Cl. .................................. 375/103; 364/724.1
[58] Field of Search ........... 364/724.01, 724.1, 724.05, 364/724.04, 724.13; 375/103

[56] References Cited

U.S. PATENT DOCUMENTS 4,691,292 9/1987 Rothweiler .................... 364/724.13

Primary Examiner—Benedict V. Safourek
Assistant Examiner—Marianne Huseman
Attorney, Agent, or Firm—Wayne J. Egan

[57] ABSTRACT

An improved complex bandpass digital filter is disclosed. According to the invention, a complex bandpass digital filter having symmetric complex coefficients is implemented using a ROM look-up table. In operation, an input bit stream is latched at a desired decimation rate and the resulting latched bits are then used to address a ROM according to the following two-cycle process: First, the bits are applied in nomal order to the ROM to obtain the real (in phase) portion of the filter output. Second, the bits are bit-reversed and then applied to the same ROM to obtain the imaginary (quadrature) portion of the filter output. Thus, complex outputs are obtained as a time-multiplexed stream from one ROM, resulting in reduced ROM storage capacity requirements.

20 Claims, 2 Drawing Sheets

COMPLEX BANDPASS DIGITAL FILTER

TECHNICAL FIELD

This invention pertains to complex bandpass filters and more particularly to complex bandpass digital filters that are implemented using a read-only memory (ROM) to look up a desired complex filter output based on a given input signal.

BACKGROUND OF THE INVENTION

Digital receivers are known in the art. As is known, such radios utilize a digital front end to sample a received signal at a sampling frequency ($f_s$), thereby converting it to a digital bit stream that includes a desired modulated information signal at an IF frequency ($f_{IF}$). The front end may, for example, utilize a bandpass sigma-delta A/D converter to perform these functions.

The bit stream is then input to a complex bandpass FIR digital filter whose response is symmetric about $f_{IF}$. This filter limits decimation-generated aliasing, and its output has both real (in-phase) and imaginary (quadrature) components. Finally, additional mixing and low pass filtering may be provided. The resulting baseband signal may then be demodulated.

Prior art complex digital filters have been implemented by providing a sample (containing a predetermined number of bits) from the input bit stream and using this sample as an address to "look up" the desired real and imaginary outputs from a read-only memory (ROM). One problem with this approach, however, has been the resulting size of the ROM required to implement the desired filter. One factor contributing to the ROM requirement, of course, is the filter's output is complex. Therefore, the ROM must have sufficient capacity to store both a real output and an imaginary output corresponding to a single filter input. The result is, of course, that the required ROM may become excessive.

As an example, consider the situation where the desired signal is at $f_s/32$ and that a decimation by 8 is to be performed. In this case, 7 alias frequency bands exist centered at $5f_s/32$, $9f_s/32$, $13f_s/32$, $17f_s/32$, $21f_s/32$, $25f_s/32$, and $29f_s/32$. The filter zeros are placed at these frequencies. The order of each zero is dependent upon the bandwidth of the desired signal and the amount of alias noise that can be tolerated. If $f_s = 14.4$ MHz and we assume 3rd order zeros are required at all alias frequencies, a 22 tap FIR filter is required. This equates to a ROM look-up filter whose inputs are 22-bit addresses. The output of the filter can take on at most only $2^{22}$ states, representing all possible combinations of the filter coefficients as combined according to the 22-bit input vector. If a 19-bit ROM filter output is required for dynamic range and filter sensitivity, the ROM would appear to require approximately 159 MBits ($2^{22}$ real words @ 19 bits per word plus $2^{22}$ imaginary words @ 19 bits per word). This example demonstrates that ROM storge capacity requirement may effectively prohibit a complex bandpass filter design for a digital receiver.

As a result, there is a need for an improved complex bandpass digital filter.

SUMMARY OF THE INVENTION

It is an object of this invention, therefore, to provide an improved complex bandpass digital filter. Accordingly, an improved complex bandpass digital filter is disclosed that is implemented using a ROM look-up table and that has symmetric complex coefficients. According to the invention, an input bit stream latched at a desired decimation rate and the resulting latched bits are then used to address a ROM according to the following two-cycle process: First, the bits are applied in normal order to the ROM to obtain the real (in phase) portion of the filter ouput. Second, the bits are bit-reversed and then applied to the same ROM to obtain the imaginary (quadrature) portion of the filter output. This results in a filter having a reduced ROM capacity requirement.

DETAILED DESCRIPTION OF THE INVENTION

Figure 1:
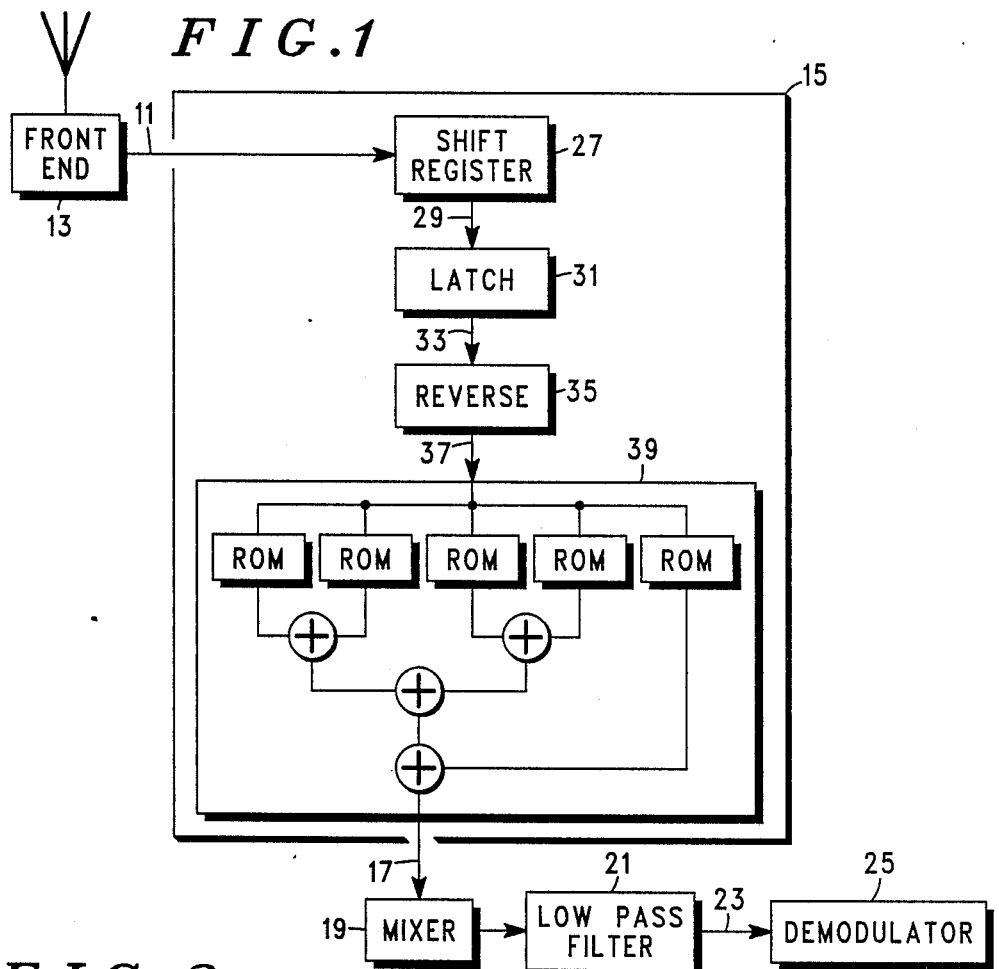
FIG. 1 is a block diagram that shows a first embodiment of a complex bandpass digital filter, according to the invention.

FIG. 1 is a block diagram that shows a first embodiment of a complex bandpass digital filter, according to the invention.

Referring now to FIG. 1, a one bit real sample stream 11 from a front end 13 that may include, for example, a bandpass sigma-delta A/D converter, is input to the filter 15. The frequency spectrum contains a desired signal at a fixed first IF frequency $f_{IF}$ (for example, 450 KHz) that is a fractional portion of the input sampling rate $f_s$ (for example, 14.4 MHz). This is coupled to a complex bandpass FIR digital filter 15 whose response is symmetric about $f_{IF}$. The filter output 17 is then input to a mixer 19 and a low pass filter 21. The result 23 is a complex signal centered at DC and sampled at a reduced rate from the input. This signal is then input to a demodulator 25.

Figure 2:
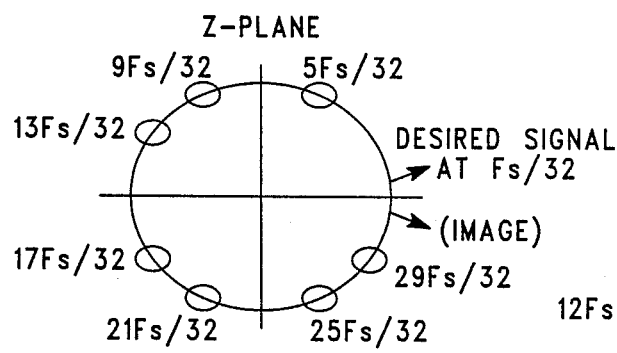
FIG. 2 is a complex-plane representation of a first filter.

As before, assuming the desired signal is at $f_s/32$ and that a decimation by 8 is to be performed, then 7 alias frequency bands exist centered at $5f_s/32$, $9f_s/32$, $13f_s/32$, $17f_s/32$, $21f_s/32$, $25f_s/32$, and $29f_s/32$. The filter zeros are placed at these frequencies, resulting in a complex-plane representation as shown in FIG. 2.

As before, the order of each zero is dependent upon the bandwidth of the desired signal and the amount of alias noise that can be tolerated. If we assume 3rd order zeros are required at all alias frequencies, a 22 tap FIR filter is required for $f_s = 14.4$ MHz.

Referring again to FIG. 1, the bit stream 11 is fed to a serial input, parallel output shift register 27. The length of this register is equal to the length of the FIR filter being implemented, 22 bits. The shift register output 29 is then input to latch 31 at the decimated rate, $f_s/n$, where n=8. Since the filter has a finite impulse response, its output depends only on the most recent 22 samples from the bit stream 11 and, since only every eighth output sample is latched, then only those must be calculated, thereby conserving power.

The latch output 33 comprises 22 bit signals that may be designated, for example, as $IN_o$–$IN_{k-1}$ (for filter input), which are then input into an address reversal circuit 35 at a rate equal to $f_s/8$. The address circuit 35 then utilizes these bits $IN_o$–$IN_{k-1}$ to provide a 22 bit address signal 37 to a ROM 39. This is a two-phase process as follows:

First, a 22-bit normal address signal is applied to the ROM 39 to generate a 19-bit real (in phase) output 17 at a clock rate of $f_s/4$. During this phase, the normal address bits designated, for example, $NOR_0$–$NOR_{21}$ (for NORmal), are bit-for-bit identical to the bits $IN_0$–$IN_{21}$ in normal order, so that $NOR_0=IN_0$, $NOR_1=IN_1$, ..., and $NOR_{21}=IN_{21}$.

Second, a 22-bit reversed address signal is applied to the ROM 39 to generate a 19-bit imaginary (quadrature) output 17 at a clock rate of $f_s/4$. During this phase, the reversed address bits designated, for example, $REV_0$–$REV_{21}$ (for REVersed), are bit-for-bit identical to the bits $IN_0$–$IN_{21}$ in reverse order, so that $REV_0=IN_{21}$, $REV_1=IN_{20}$, ..., and $REV_{21}=IN_0$.

The address reversal circuit 35 causes the normal address cycle and the reversed address cycle to interleave so that a time-multiplexed complex filter output (including both a real and imaginary component) may be read from the ROM output 17 at a composite rate equal to $f_s/8$.

Figure 3:
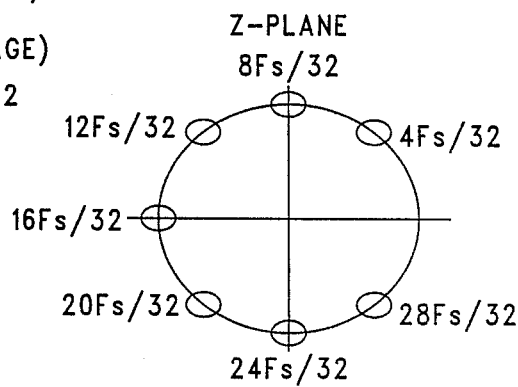
FIG. 3 is a complex-plane representation of a second filter.

Referring to FIG. 3, there is shown a Z-plane representation of a digital filter with real coefficients. This filter is the lowpass equivalent for the desired bandpass filter of FIG. 2. The difference between the two filters is a counterclockwise rotation of $f_{IF}=f_s/32$, or 450 KHz. (Recall, $f_s=14.4$ MHz.) In order to accomplish this rotation, the impulse response of the real filter must be multiplied by the complex quantity $e(j2pn/32+f)$. By applying Euler's identity, this quantity can be divided into a real cosine portion and imaginary sine portion. If the phase angle f is chosen such that the cosine phase is the mirror image of the sine phase with the reflection point being aligned with the reflection point of the symmetric impulse response of the lowpass filter, the result of the multiplication will be a bandpass filter whose complex coefficients are symmetric. In operation then, the latched bits $IN_0$–$IN_{21}$ are input to the ROM 39 to obtain the real (in phase) portion of the output. The latched bits are then reversed as $IN_{21}$–$IN_1$ and again input to the ROM 39 to obtain the imaginary (quadrature) portion of the output.

In practice, the over-all ROM capacity requirement can be further reduced by dividing the ROM 39 into several (such as 5) smaller ROMs (or sub-ROMs) whose outputs are combined by an adder tree. The tables are formed by independently summing groups or filter coefficients. Adders can then be traded off for ROM space. As shown, the 22-bit ROM input 37 is split to form the corresponding addresses of each of five sub-ROMs, the sub-results then combined by four adders to form the 19-bit ROM output 17.

Another technique to reduce ROM size involves the interpretation of the address signals. Each bit in the address represents a state at the filter input. In a direct form implementation, this input bit is multiplied by the corresponding filter coefficient and summed in to the overall output. Since an input bit takes on the values 1 or 0, this can be interpreted to mean add the coefficient (1) or do not add the coefficient (0). If instead, this is understood to mean add the coefficient (1) or subtract the coefficient (0), the ROMs will be symmetric about their center with the exception of the sign. This interpretation is easily accounted for in analysis by adjustment of the maximum input value. By selecting true or complemented ROM outputs, the sign inversion can be accounted for and the ROM size can be further reduced.

While various embodiments of the complex bandpass digital filter, according to the invention, have been described hereinabove, the scope of the invention is defined by the following claims.

What is claimed is:

1. A radio including a front end, said front end having means responsive to a received signal for providing a digital bit stream comprising a desired signal at an IF frequency, $f_{IF}$, and for coupling said digital bit stream to a bandpass digital filter having a complex response symmetric about said $f_{IF}$, said digital filter comprising:

means for providing said digital bit stream to a shaft register at a sampling frequency, $f_s$, said $f_s$ being a multiple of $f_{IF}$, said shift register having latching means for providing a filter input comprising k bit signals, $IN_0$–$IN_{k-1}$, to an address circuit at a rate of $f_s/n$, where n=a decimation rate;

said address circuit having means, responsive to said filter input, for providing at least a normal filter address and a reversed filter address to a read-only memory, said normal filter address comprising at least k bit signals, $NOR_0$–$NOR_{k-1}$, so that $NOR_0=IN_0$, $NOR_1=IN_1$, ..., and $NOR_{k-1}=IN_{k-1}$;

said reversed filter address comprising at least k bit signals, $REV_0$–$REV_{k-1}$, so that $REV_0=IN_{k-1}$, $REV_1=IN_{k-2}$, ..., and $REV_{k-1}=IN_0$;

said read-only memory having means, responsive to said normal filter address, for providing a real, or in-phase, digital filter output comprising m bit signals, $REAL_0$–$REAL_{m-1}$, and having means, responsive to said reversed filter address, for providing an imaginary, or quadrature, digital filter output comprising m bit signals, $IMAG_0$–$IMAG_{m-1}$.

2. The radio of claim 1 wherein said address circuit includes means for providing said normal filter address at a rate equal to $f_s/n$ and also said reversed filter address at a rate equal to $f_s/n$.

3. The radio of claim 2 wherein said address circuit includes means for providing said normal filter address and said reversed filter address in a time-interleaved stream at a rate equal to $2f_s/n$.

4. The radio of claim 3 wherein n=8.

5. The radio of claim 4 wherein $f_{IF}=450$ KHz.

6. The radio of claim 5 wherein $f_s=14.4$ MHz.

7. The radio of claim 6 wherein k=22.

8. The radio of claim 7 wherein m=19.

9. The radio of claim 1 wherein said front end includes a sigma-delta Analog to Digital (A/D) converter.

10. The radio of claim 1 wherein said read-only memory is divided into several sub- read-only memories whose outputs are combined by an adder tree.

11. A bandpass digital filter having a comlex response symmetric about an IF frequency, $f_{IF}$, said digital filter comprising:

means for receiving a digital bit stream comprising a desired signal at said $f_{IF}$, means for providing said digital bit stream to a shift register at a sampling frequency, $f_s$, said $f_s$ being a multiple of $f_{IF}$, said shift register having latching means for providing a filter input comprising k bit signals, $IN_0$–$IN_{k-1}$, to an address circuit at a rate of $f_s/n$, where n=a decimation rate;

said address circuit having means, responsive to said filter input, for providing at least a normal filter address and a reversed filter address to a read-only memory, said normal filter address comprising at least k bit signals, $NOR_0$–$NOR_{k-1}$, so that $NOR_0 = IN_0$, $NOR_1 = IN_1$, ..., and $NOR_{k-1} = IN_{k-1}$;

said reversed filter address comprising at least k bit signals, $REV_0$–$REV_{k-1}$, so that $REV_0 = IN_{k-1}$, $REV_1 = IN_{k-2}$, ..., and $REV_{k-1} = IN_0$;

said read-only memory having means, responsive to said normal filter address, for providing a real, or in-phase, digital filter output comprising m bit signals, $REAL_o$–$REAL_{m-1}$, and having means, responsive to said reversed filter address, for providing an imaginary, or quadrature, digital filter output comprising m bit signals, $IMAG_o$–$IMAG_{m-1}$.

12. The digital filter of claim 11 wherein said address circuit includes means for providing said normal filter address at a rate equal to $f_s/n$ and also said reversed filter address at a like rate.

13. The digital filter of claim 12 wherein said address circuit includes means for providing said normal filter address and said reversed filter address in a time-interleaved stream at a rate equal to $2f_s/n$.

14. The digital filter of claim 13 wherein $n = 8$.

15. The digital filter of claim 14 wherein $f_{IF} = 450$ KHz.

16. The digital filter of claim 15 wherein $f_s = 14.4$ MHz.

17. The digital filter of claim 16 wherein $k = 22$.

18. The digital filter of claim 17 wherein $m = 19$.

19. The digital filter of claim 11 wherein said receiving means includes a sigma-delta Analog to Digital (A/D) converter.

20. The digital filter of claim 11 wherein said read-only memory is divided into several sub- read-only memories whose outputs are combined by an adder tree.

* * * * *

UNITED STATES PATENT AND TRADEMARK OFFICE
CERTIFICATE OF CORRECTION

PATENT NO. : 4,953,184

DATED : 08/28/90

INVENTOR(S) : Daniel A. Simone

It is certified that error appears in the above-identified patent and that said Letters Patent is hereby corrected as shown below:

At column 4, line 14, "shaft" should be --shift--.

At column 4, line 57, "comlex" should be --complex--.

Signed and Sealed this

Ninth Day of June, 1992

Attest:

DOUGLAS B. COMER

*Attesting Officer*     Acting Commissioner of Patents and Trademarks